(12) United States Patent
Nakagaki et al.

(10) Patent No.: US 7,710,793 B2
(45) Date of Patent: May 4, 2010

(54) WRITE VOLTAGE GENERATING CIRCUIT AND METHOD

(75) Inventors: Yuichiro Nakagaki, Yokohama (JP); Takuya Ariki, Yokohama (JP)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 69 days.

(21) Appl. No.: 12/191,537

(22) Filed: Aug. 14, 2008

(65) Prior Publication Data

US 2009/0046518 A1    Feb. 19, 2009

(30) Foreign Application Priority Data

Aug. 14, 2007 (JP) .............................. 2007-211478
Feb. 25, 2008 (KR) ...................... 10-2008-0016906

(51) Int. Cl.
G11C 7/06 (2006.01)
(52) U.S. Cl. .............................. 365/189.07; 365/189.09
(58) Field of Classification Search ............ 365/189.07, 365/189.09, 185.18, 185.23
See application file for complete search history.

(56) References Cited

U.S. PATENT DOCUMENTS 6,331,960 B1 * 12/2001 Miyamoto .................. 365/219
2007/0064495 A1 * 3/2007 Shibata .................. 365/185.28

FOREIGN PATENT DOCUMENTS

JP       2002230985 A    8/2002

* cited by examiner

Primary Examiner—Vu A Le
(74) Attorney, Agent, or Firm—Volentine & Whitt, PLLC

(57) ABSTRACT

Provided are a write voltage generating circuit of a non-volatile memory cell and a write voltage generating method. The write voltage generating circuit includes a voltage generating unit providing a preliminary write voltage at a level below a defined target level, a voltage sensing unit receiving the preliminary write voltage and a reference signal, and in response to a comparison between the preliminary write voltage and the reference signal generating a start signal, and a switching unit generating and applying a write voltage derived from the preliminary write voltage at a writeable level to a non-volatile memory cell during the write operation in response to the start signal, wherein the writeable level is less than the target level.

20 Claims, 12 Drawing Sheets

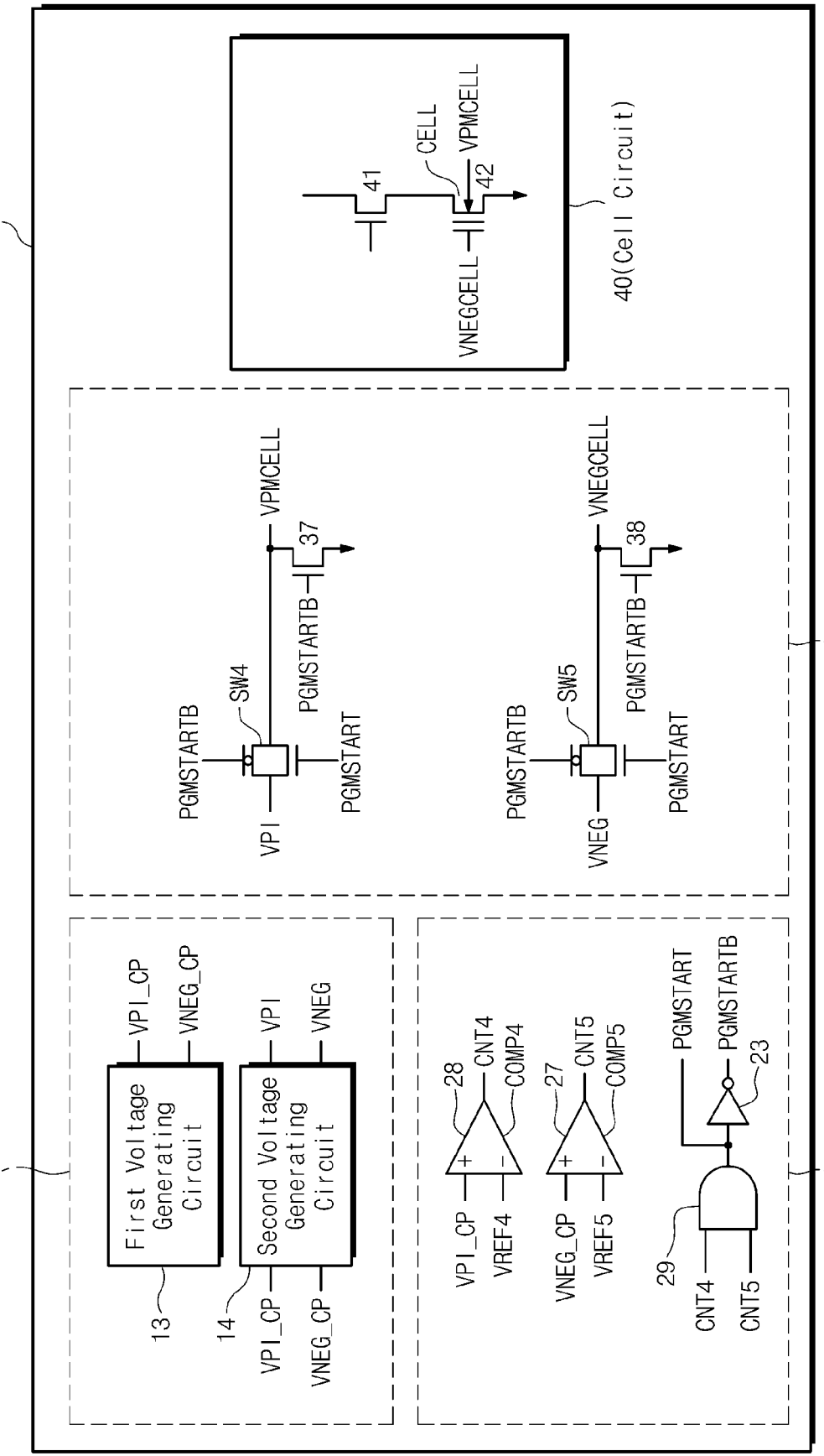

WRITE VOLTAGE GENERATING CIRCUIT AND METHOD

CROSS-REFERENCE TO RELATED APPLICATIONS

This U.S. non-provisional patent application claims priority under 35 U.S.C. §119 to Japanese Patent Application No. P-2007-00211478 filed on Aug. 14, 2007, and Korean Patent Application No. 10-2008-0016906 filed on Feb. 25, 2008, the collective subject matter of which is hereby incorporated by reference.

BACKGROUND

The present invention relates generally to write voltage generating circuits and related write voltage generating methods. More particularly, the invention relates to a write voltage generating circuit and method for use with a non-volatile memory device.

So-termed write operations performed in the context of non-volatile memory devices include program operations, erase operations, etc. A write operation typically starts only after related voltages provided by a write voltage generating circuit have reached their target values, or after a defined period of time has elapsed, where said period of time is deemed sufficient to allow the voltages to reach their target values.

Figure (FIG.) 1 is a timing diagram illustrating changes in certain write voltage levels over time beginning with the start of a constituent write operation (i.e., a typical program operation). Referring to FIG. 1, in response to the start of charge pump operation, each voltage level for; (1) a high write voltage (VPI_CP), (2) a program bit line voltage (VPB_CP), and (3) a program bulk voltage (VBULK_CP) begins its transition towards a defined target value. Once the charge pump reaches operative saturation and each voltage reaches its target value, a write start signal (PGMSTART) activates (e.g., transitions from a low to a high logic level) to begin the write operation. In conventional nonvolatile memory devices, the requisite voltage settling time (TC) associated with the generation of these voltages may actually take about the same time amount of time as the subsequently performed write operation. As such, the voltage settling time (TC) represents a serious impediment to ongoing attempts to reduce the overall time requires perform a write operation, whether a program operation, an erase operation, etc.

In sum, once a write command is received by a conventional non-volatile memory device, an internal voltage boosting circuit begins boosting various voltages implicated in the write operation. Only after the voltage boosting operation(s) are complete can the write operation be performed. Recognizing the numerous write operations may be performed in relation to the nonvolatile memory device, the operation of the internal voltage boosting circuit becomes an important design consideration. For example, once a particular write operation is complete, an associated internal voltage boosting circuit does not necessarily assume a state effectively supporting subsequent (i.e., continuous) write operations, (i.e., such that the time interval between successive ON/OFF operations may be reduced). See, for example, Japanese Publication Patent No. 2002-230985.

SUMMARY OF THE INVENTION

Embodiments of the invention provide a write voltage generating circuit and method capable of starting a write operation before constituent write voltages boosted by charge pumping reach their target value during a write operation performed in a non-volatile memory device.

In one embodiment, the invention provides a write voltage generating circuit operating during a write operation and comprising; a voltage generating unit providing a preliminary write voltage at a level below a defined target level, a voltage sensing unit receiving the preliminary write voltage and a reference signal, and in response to a comparison between the preliminary write voltage and the reference signal generating a start signal, and a switching unit generating and applying a write voltage derived from the preliminary write voltage at a writeable level to a non-volatile memory cell during the write operation in response to the start signal, wherein the writeable level is less than the target level.

In another embodiment, the invention provides a write voltage generating method, comprising; determining whether a write operation is a program operation and if so, determining that a program voltage having a defined target level has reached a programmable level below the target level, generating a control signal in response to the determination that the program voltage has reached the programmable level, and providing the program voltage to a nonvolatile memory cell in response to the control signal; and determining whether the write operation is an erase operation and if so, determining that an erase voltage having a defined target level has reached an erasable level below the target level, generating a control signal in response to the determination that the erase voltage has reached the erasable level, and providing the erase voltage to a nonvolatile memory cell in response to the control signal.

In another embodiment, the invention provides a memory system comprising; a non-volatile memory device; and a memory controller controlling the non-volatile memory device. The nonvolatile memory device comprises a memory cell array and a write voltage generating circuit generating a write voltage during a write operation performed on the memory cell array, wherein the write voltage generating circuit comprises; a voltage generating unit providing a preliminary write voltage at a level below a defined target level, a voltage sensing unit receiving the preliminary write voltage and a reference signal, and in response to a comparison between the preliminary write voltage and the reference signal generating a start signal, and a switching unit generating and applying a write voltage derived from the preliminary write voltage at a writeable level to a non-volatile memory cell during the write operation in response to the start signal, wherein the writeable level is less than the target level.

BRIEF DESCRIPTION OF THE FIGURES

FIG. 7 is a diagram illustrating voltage generating circuitry according to another embodiment the invention;

DESCRIPTION OF EMBODIMENTS

Hereinafter, exemplary embodiments of a write voltage generating circuit according to various embodiments of the invention will be described with reference to the accompanying drawings. The illustrated embodiments describe write voltage generating circuit design and operation in relation to a write voltage generation during a program operation and an erase operation. In this context, the term "write voltage(s)" refers to any voltage necessarily of desirable generated to perform a write operation within a nonvolatile memory device.

Figure 1:
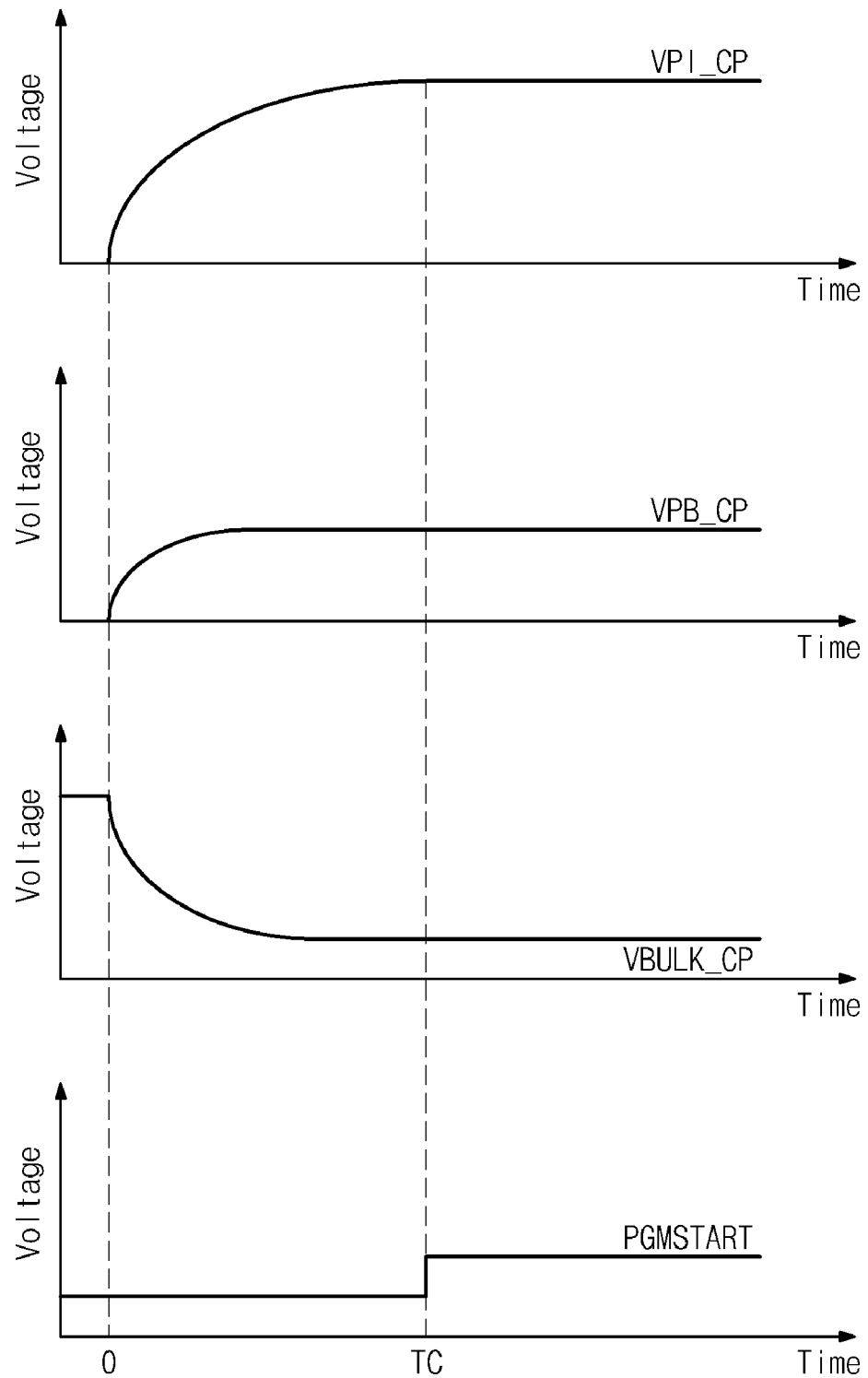
FIG. 1 is a timing diagram illustrating the generation of write voltages according to a conventional example.
Figure 2:
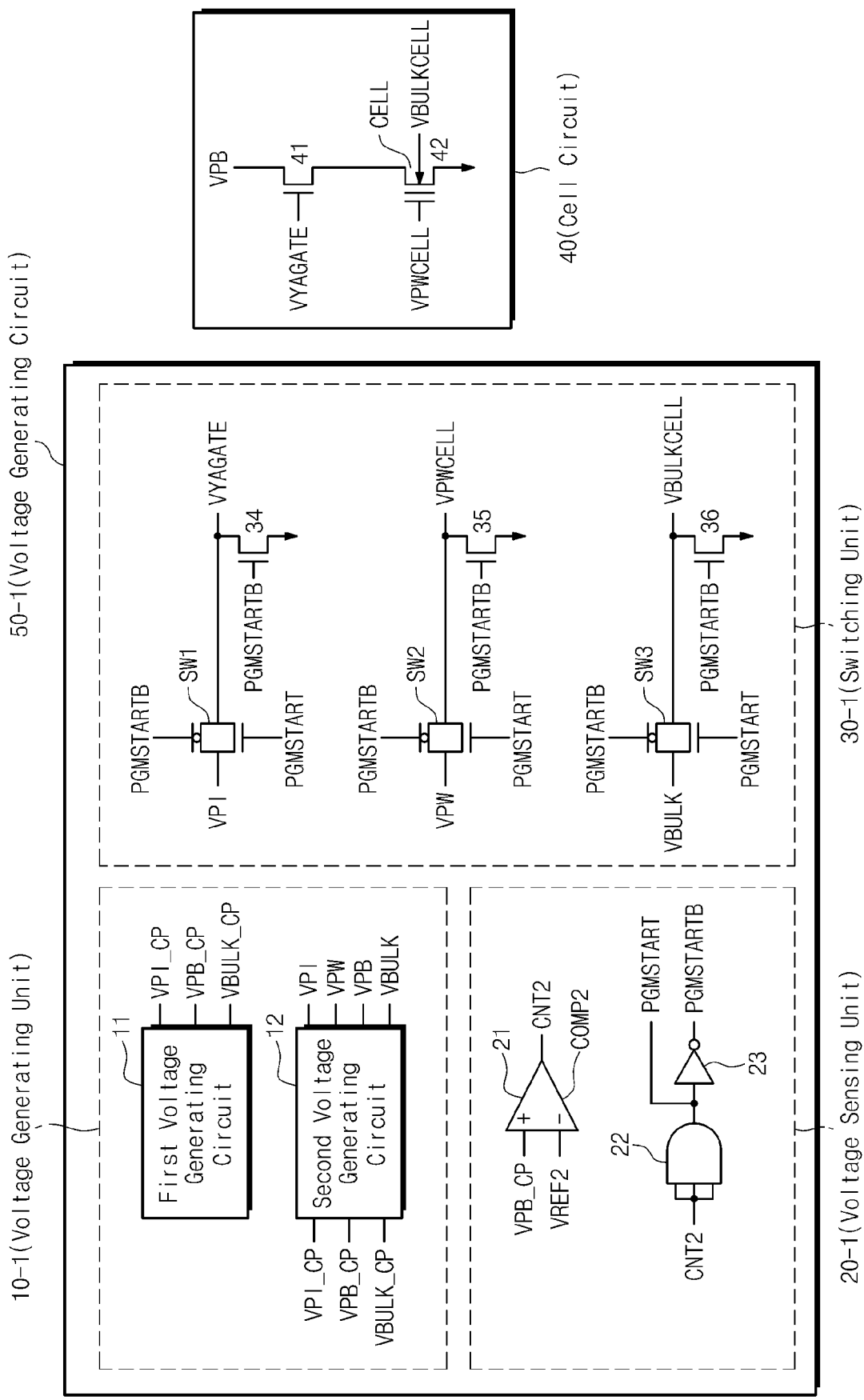
FIG. 2 is a diagram illustrating voltage generating circuitry according to an embodiment of the invention.

FIG. 2 is a diagram illustrating a voltage generating circuit generating write voltages during a program operation according to an embodiment to the invention. Referring to FIG. 2, a voltage generating circuit 50-1 comprises a voltage generating unit 10, a voltage sensing unit 20-1, and a switching unit 30_1 that cooperate to provide a program voltage to the memory cell circuit 40.

Voltage generating unit 10_1 includes a first voltage generating circuit 11 incorporating a charge pump (not shown) and a second voltage generating circuit 12 incorporating a regulator (not shown). A preliminary program bit line voltage (VPB_CP), a preliminary write high voltage (VPI_CP), and a preliminary program bulk voltage (VBULK_CP) are generated by the charge pump in first voltage generating circuit 11. These preliminary write voltages are then applied to and adjusted by the regulator in second voltage generating circuit 12 before being output, respectively, as program bit line voltage (VPB), write high voltage (VPI), and program bulk voltage (VBULK). Second voltage generating circuit 12 also generates and outputs a program word line voltage (VPW) from the related write voltages.

Voltage sensing unit 20-1 comprises a comparator COMP2 21, an AND circuit 22, and an inverter 23 connected to the output of AND circuit 22. The preliminary program bit line voltage (VPB_CP) is applied to the non-inverting input of comparator COMP2 21, and a reference voltage VREF2 is applied to the inverting input of comparator COMP2 21. When the preliminary program bit line voltage (VPB_CP) reaches the same level as the reference voltage VREF2, comparator COMP2 21 outputs a control signal CNT2. AND circuit 22 receives the control signal CNT2, and generates a first program start signal (PGMSTART). Inverter 23 logically inverts the first program start signal (PGMSTART) to provide (an inverted) second program start signal (PGMSTARTB).

Switching unit 30_1 comprises complementary first through third MOS transistor switches SW1 to SW3 and associated NMOS transistors 34, 35, and 36 respectively connected between the output terminal of each complementary MOS transistor switches SW1 to SW3 and ground voltage. The write high voltage (VPI) is applied to the input terminal of first complementary MOS transistor switch SW1 and first and second start signals (PGMSTART and PGMSTARTB) are applied to respective gates of first complementary MOS transistor switch SW1. In response, a bit line select signal (VYAGATE) is output from first complementary MOS transistor switch SW1. The second start signal PGMSTARTB also applied to the gate of first NMOS transistor 34. If first complementary MOS transistor switch SW1 is turned OFF, the first NMOS transistor 34 adjusts the voltage level of the output of first complementary MOS transistor switch SW1 to ground.

In similar manner, a program word line cell voltage (VPWCELL) and a program bulk cell voltage (VBULKCELL) are respectively provided by second and third complementary MOS transistor switches SW2 and SW3.

Within memory cell circuit 40, the bit line select signal (VYAGATE) is applied to the gate of a bit line selection NMOS transistor 41 connected to the drain of memory cell 42. The program word line cell voltage (VPWCELL) is applied to the gate of memory cell 42, and the program bulk cell voltage (VBULKCELL) is applied to the bulk region (e.g., a P-well region) of memory cell 42. The program bit line voltage (VPB) is applied to the drain of bit line selection NMOS transistor 41 in order to implement a bit line selection function.

Figure 3:
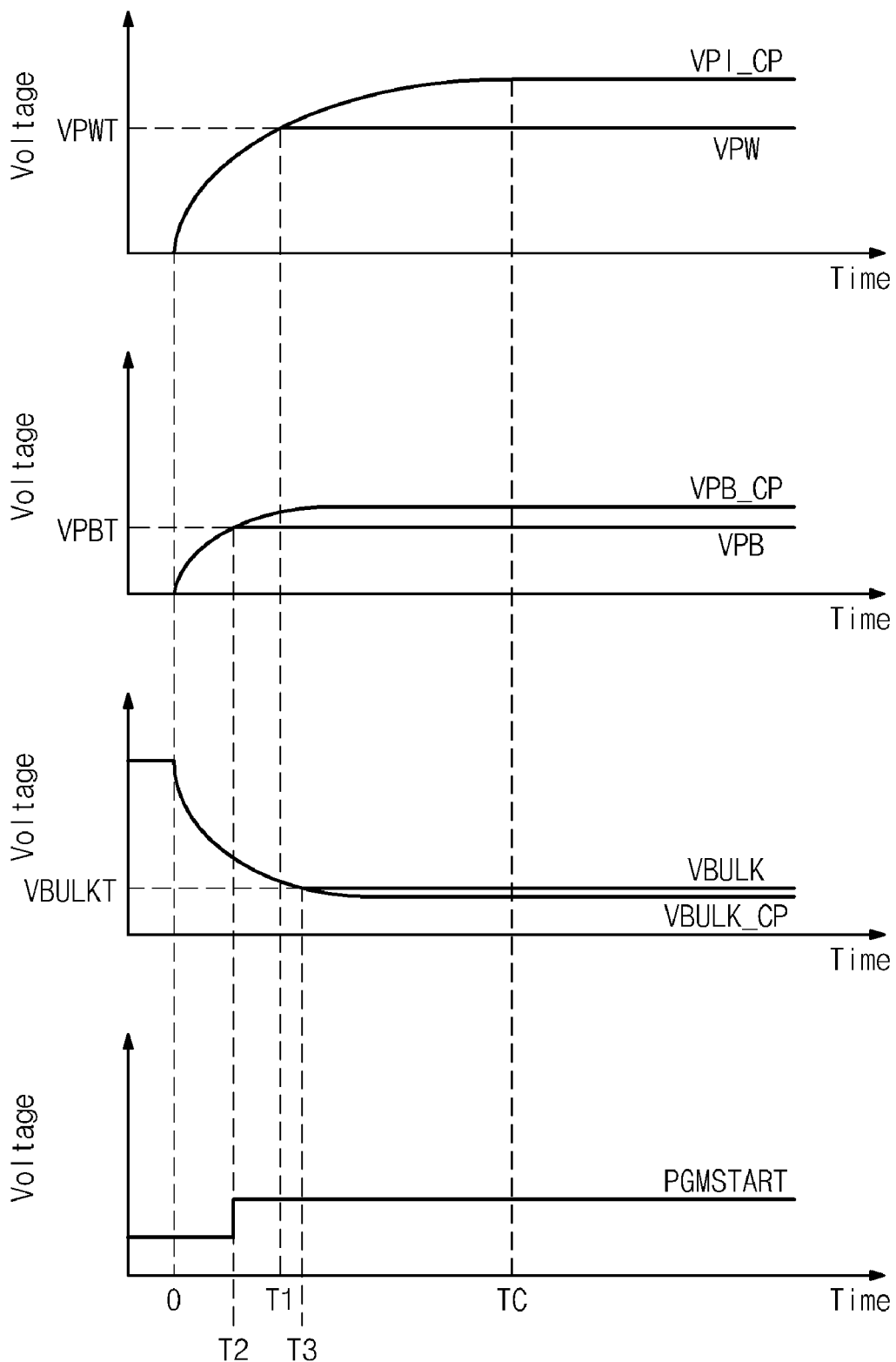
FIG. 3 is a timing diagram illustrating the generation of write voltages according to an embodiment of the invention.

FIG. 3 is a timing diagram illustrating the generation of various write voltages during a program operation according to an embodiment of the invention. Of note, the program operation is able to begin at a pre-threshold time (T2) before threshold time (T1), where threshold time (T1) is defined as the point in time where preliminary write high voltage (VPI_CP) reaches a level equal to the program voltage word line (VPW).

Referring collectively to FIGS. 2 and 3, at the pre-threshold time T2, the preliminary program bit line voltage (VPB_CP) generated by the charge pump in first voltage generating circuit 11 in voltage generating unit 10_1 reaches a predetermined bit line threshold voltage (VPBT) equal to the program bit line voltage (VPB). That is comparator COMP2 compares the level of the preliminary program bit line voltage (VPB_CP) to the predetermined bit line threshold voltage (VPBT) and generates the control signal CNT2. In response to the control signal CNT2, the first and second start signals (PGMSTART and PGMSTARTB) are generated.

The first and second start signals (PGMSTART and PGMSTARTB) are applied to the respective gates of the first through third complementary MOS transistor switches SW1 to SW3 and the switch turn ON. Accordingly, the necessary write voltages required for operation of cell circuit 40 during the program operation are provided. That is, when the bit line select signal (VYAGATE) is applied to the gate of bit line selection NMOS transistor 41, this transistor is turned ON, such that the program bit line voltage (VPB) is provided to the drain of memory cell 42. Additionally, when the program word line cell voltage (VPWCELL) is applied to the gate of memory cell 42 and the program bulk cell voltage (VBULKCELL) is applied to the bulk of memory cell 42, the program operation may be performed in relation to memory cell 42.

As mentioned above, at a point in time where the preliminary program bit line voltage (VPB_CP) reaches a programmable level, the program operation may be performed in relation to memory cell 42. At this point, the program word line voltage (VPW) and the program bulk voltage (VBULK) may not have reached their respective target levels. However, due to the programming characteristics of memory cell 42, when the program word line voltage (VPW) reaches the predetermined target level, a write operation may nonetheless be performed on memory cell 42.

This outcome stands in marked contrast to the conventionally requisite voltage settling time (TC) associated with the generation of write voltages in relation to convention nonvolatile memory devices. That is, the period of time from the start of the write (e.g., a program) operation at start time "0" to the pre-threshold time T2 is much shorter than the period of time from start time to the end of the conventionally requisite voltage settling time (TC).

Figure 4:
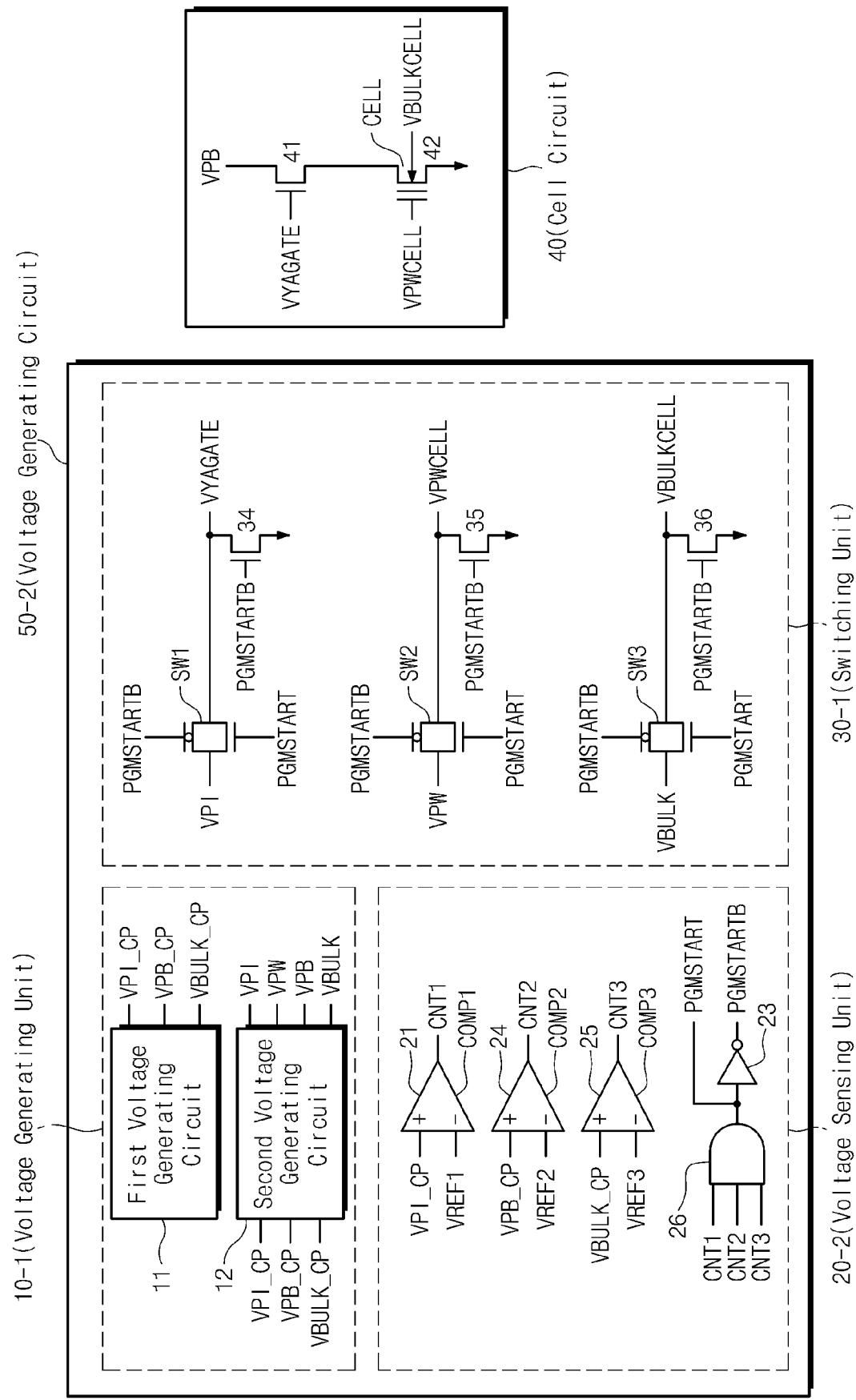
FIG. 4 is a diagram illustrating voltage generating circuitry according to another embodiment of the invention.

FIG. 4 is a diagram illustrating a voltage generating circuit according to another embodiment of the invention. Here again, a program operation is used as an example of a write operation and voltage generating circuit operation during the write operation. Within this particular embodiment, voltage generating unit 10_1 and a switching unit 30_1 are essentially the same in structure and operation as described above in relation to the embodiment shown in FIG. 2. However, voltage generating circuit 50-2 also comprises a voltage sensing unit 20-2 slightly different from voltage sensing unit 20-1 of FIG. 2. Namely, voltage sensing unit 20-2 further comprises second and third comparators COMP2 and COMP 3, and AND gate 26 receives different input signals.

As before, preliminary write high voltage (VPI_CP) and a first reference voltage (VREF1) are applied to first comparator COMP1 21 to generate the first control signal CNT1. In one embodiment of the invention, the first reference voltage VREF1 may have the same voltage level as the program word line voltage (VPW). The first control signal is generated when the preliminary write high voltage (VPI_CP) reaches the level of the first reference voltage VREF1.

In similar manner, the preliminary program bit line voltage (VPB_CP) and the preliminary program bulk voltage (VBULK_CP) are applied to the respective non-inverting inputs of the second and third comparators COMP2 24 and COMP3 25 in relation to second and third reference voltages (VREF 2 and VREF3) applied to the inverting inputs of the second and third comparators COMP2 and COMP3.

In one embodiment of the invention, the second reference voltage VREF2 may have the same voltage level as the program bitline voltage (VPB). That is, once the preliminary program bit line voltage (VPB_CP) reaches a defined level of the program bit line voltage (VPB), the second comparator COMP2 24 will generate the second control signal CNT3.

In one embodiment of the invention, the third reference voltage VREF3 may have the same voltage level as the program bulk voltage (VBULK). That is, once the preliminary program bulk voltage (VBULK_CP) reaches a defined level of the program bulk voltage (VBULK), the third comparator COMP3 25 will generate the third control signal CNT3.

The first through third control signals CNT1 to CNT3 provided by the first through third comparators COMP1 to COMP3 are applied as inputs to the combination of AND circuit 26 and inverter 23 to generate first and second start signals (PGMSTART and PGMSTARTB). As described in relation to FIG. 2, the first and second start signals (PGMSTART and PGMSTARTB) are applied to the first through third complementary MOS transistor switchers SW1 to SW3.

Figure 5:
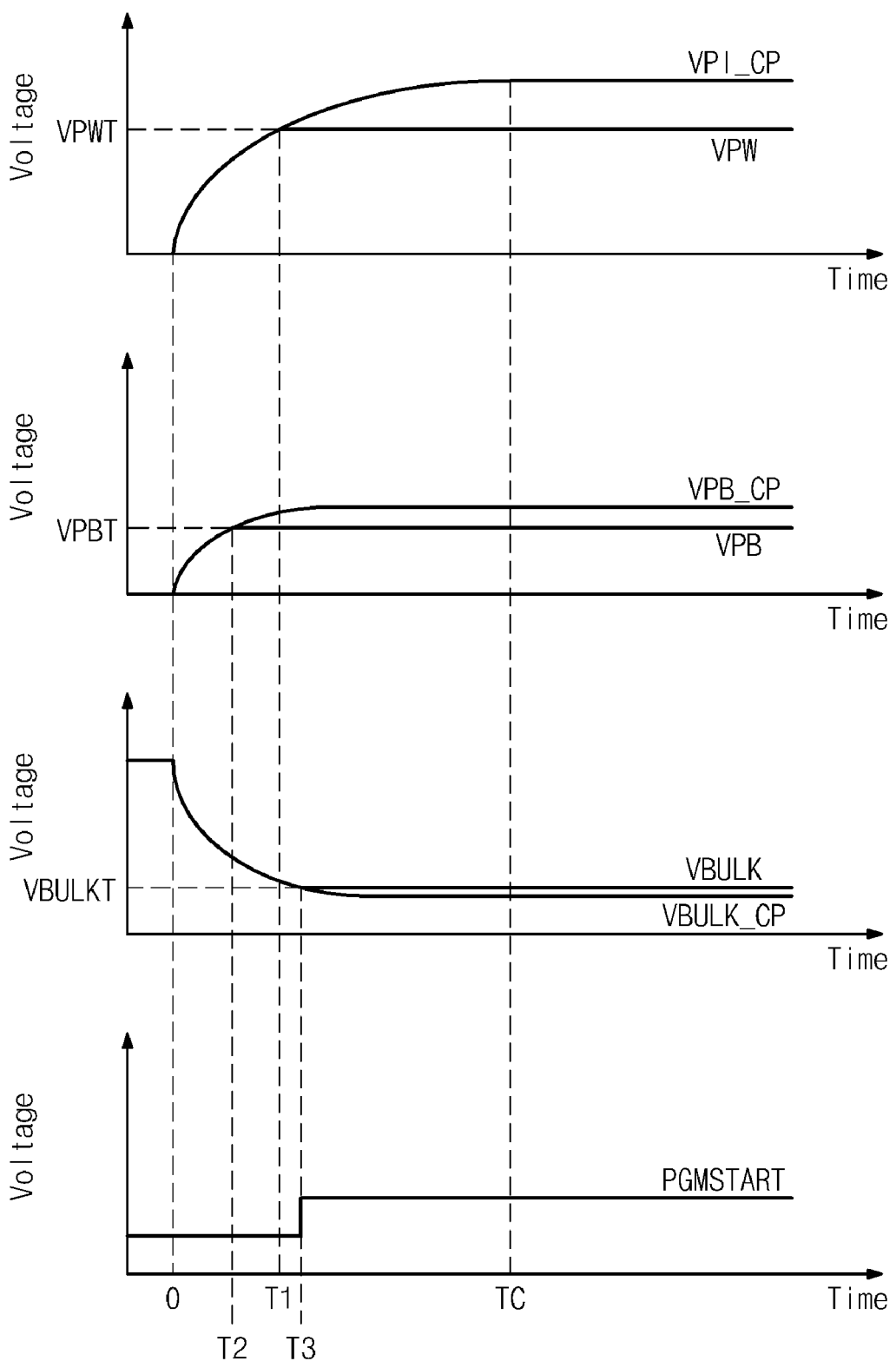
FIG. 5 is a timing diagram illustrating the generation of write voltages according to an embodiment of the invention.

FIG. 5 is a timing diagram illustrating the generation of write voltages during a program operation according to another embodiment of the invention. Of note, the program operation is able to begin at a post-threshold time (T3) occurring just slightly after (or proximate in time with) the threshold time (T1), where threshold time (T1) is defined as the point in time where preliminary write high voltage (VPI_CP) reaches a level equal to the program voltage word line VPW. The post-threshold time (T3) is defined as the point in time where the preliminary program bulk voltage (VBULK_CP) reaches a defined level for the program bulk voltage (VBULK).

The example illustrated in FIG. 5 assumes a program operation being performed with write voltage generating circuit 50-2 of FIG. 4. The program start time (i.e., post-threshold time T3) occurs later than the pre-threshold time (T2). However, this program operation start time allows the program bit line voltage (VPB), the program word line voltage (VPW), and the program bulk voltage (VBULK) to be reached by respective preliminary write voltages before the program operation starts. Accordingly, as compared with the embodiment of write voltage generating circuit 50-1 described above, a more reliable program operation can be performed. The period of time defined between command starts time "0" and the post-threshold time T3 is still much shorter than the conventionally requisite voltage settling time (TC), and the overall time required for the program operation may be reduced.

Figure 6:
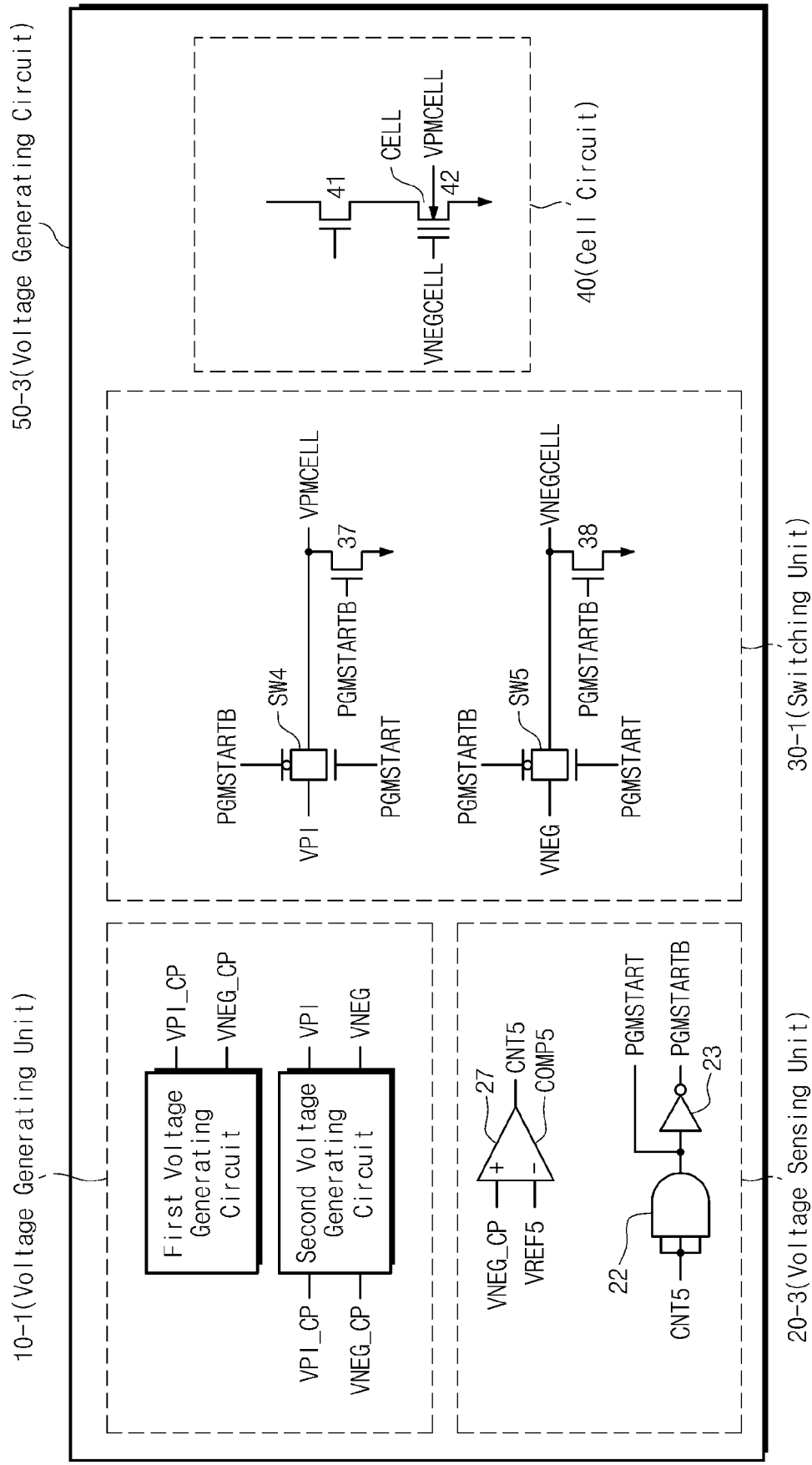
FIG. 6 is a diagram illustrating voltage generating circuitry according to another embodiment the invention.

FIG. 6 is a diagram illustrating a voltage generating circuit according to another embodiment of the invention. Here, however, the embodiment is drawn to an erase operation as an example of a write operation. Referring to FIG. 6, a voltage generating circuit 50-3 comprises a voltage generating unit 10_2, a voltage sensing unit 20-3, and a switching unit 30_2 providing erase voltages to the memory cell in cell circuit 40.

The voltage generating unit 10_2 includes a first voltage generating circuit 13 incorporating a charge pump and a second voltage generating circuit 14 including a regulator. A preliminary high write voltage (VPI_CP) and a preliminary high negative voltage (VNEG_CP) are generated by the charge pump of the first voltage generating circuit 13, and then adjusted by the regulator in second voltage generating circuit 14 to provide high voltage (VPI) and a high negative voltage (VNEG). These output voltages are exemplary "erase voltages" used during the erase operation.

Voltage sensing unit 20-3 comprises a comparator COMP5 27, an AND circuit 22, and an inverter 23 connected to the output of AND circuit 22. The preliminary high negative voltage (VNEG_CP) is applied to the non-inverting input of comparator COMP5 27 and first reference voltage VREF5 is applied to the inverting input of comparator COMP5 27. When a voltage level of the preliminary high negative voltage (VNEG_CP) reaches a defined level of the first reference voltage VREF5, comparator COMP5 outputs a control signal CNT5. In one embodiment of the invention, the reference voltage VREF5 is established at a minimal level at which the preliminary high negative voltage (VNEG_CP) is able to effectively perform an erase operation. When the preliminary high negative voltage (VNEG_CP) reaches this point, AND circuit 22 receives an activated control signal CNT5, and outputs a first start signal (PGMSTART). Inverter 23 generates the second (an inverted version of PGMSTART) start signal (PGMSTARTB).

Switching unit 30_2 comprises first and second complementary MOS transistor switches SW4 and SW5 and associated NMOS transistors 37 and 38 connected between respective output terminals of the complementary MOS transistor switches SW4 and SW5 and ground. The high write voltage (VPI) is applied to the input of the first complementary MOS transistor switch SW4 and the start signals (PGMSTART and PGMSTARTB) are respectively applied to the gates of the first complementary MOS transistor switch SW4. The second start signal (PGMSTARTB) is also applied to NMOS transistor 37 which adjusts the output of the first complementary MOS transistor switch SW4 relative to ground. This output is an erase high bulk voltage VPMCELL. In similar manner, a high negative cell voltage VNEGCELL is provided by the second complementary MOS transistor switch SW5.

In cell circuit 40, the high negative voltage (VNEGCELL) is applied to the gate of memory cell 42, and erase high bulk voltage (VPMCELL) is applied to a bulk (e.g., a region P-well region) of memory cell 42. This particular voltage generating circuit according to an embodiment of the invention may be operated in accordance with the same timing margins as those described above in relation to FIG. 2.

That is, the period of time required for the high negative voltage (VNEGCELL) to reach an erasable voltage level is considerably shorter than the time period typically required for high write voltage (VPI) to reaches a similarly effective voltage level. Accordingly, by operation of comparator COMP5 27, when preliminary high negative voltage (VNEG_CP) reaches a defined minimal threshold sufficient for the erase operation, the first complementary MOS transistor switch SW5 of switching unit 30_2 is turned ON, and a high negative voltage (VNEGCELL) is applied to memory cell 42. Simultaneously, since the first complementary MOS transistor switch SW5 of switching unit 30_2 is turned ON, the write high voltage (VPI) is applied to the bulk of memory cell 42 as erase high bulk voltage (VPMCELL). Therefore, memory cell 42 may be effectively erased, and the overall erase operation may be performed within a shorter time period.

FIG. 7 is a diagram illustrating a voltage generating circuit providing erase voltages during an erase operation according to another embodiment of the invention. Referring to FIG. 7, voltage generating unit 10_2 and switching unit 30_2 of voltage generating circuit 50-4 have essentially the same structure and operation as similar elements described in relation to FIG. 6. However, voltage sensing unit 20-4 additionally comprises a second comparator COMP4.

First and second control signals CNT4 and CNT5 provided by first and second comparators COMP4 and COMP5 are applied to the combination of AND circuit 29 and inverter 23 in order to generate first and second start signals (PGMSTART and PGMSTARTB). These signals are then applied to first and second complementary MOS transistor switches SW4 and SW5 and associated NMOS transistors 37 and 38 connected between each output terminal of the first and second complementary MOS transistor switches SW4 and SW5 and ground. In response to first and second start signals (PGMSTART and PGMSTARTB), once the erase voltages required for performing the erase operation are minimally ready, the erase operation may start. Voltage generating circuit 50-4 operates according to the same timing margins as voltage generating circuit 50_3 of FIG. 4.

Thus, as described above in relation to several embodiments of the invention, a voltage generating circuit comprises a voltage generating circuit adapted for use during a program operation and/or an erase operation. That is, through a combination of a program voltage generating circuit (reference e.g., FIGS. 2 and 4) and an erase voltage generating circuit (reference e.g., FIGS. 6 and 7), a more generally applicable write voltage generating circuit according to an embodiment of the invention may be realized. Those of ordinary skill in the art will recognize that commonality of use for various circuits may be achieved in such write voltage generating circuits.

Figure 8A:
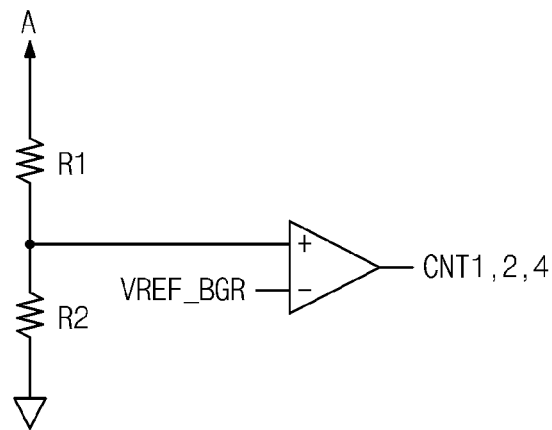
FIGS. 8A and 8B are exemplary input voltage setting circuits adapted for use in the process of input voltage setting within a voltage sensing unit.
Figure 8B:
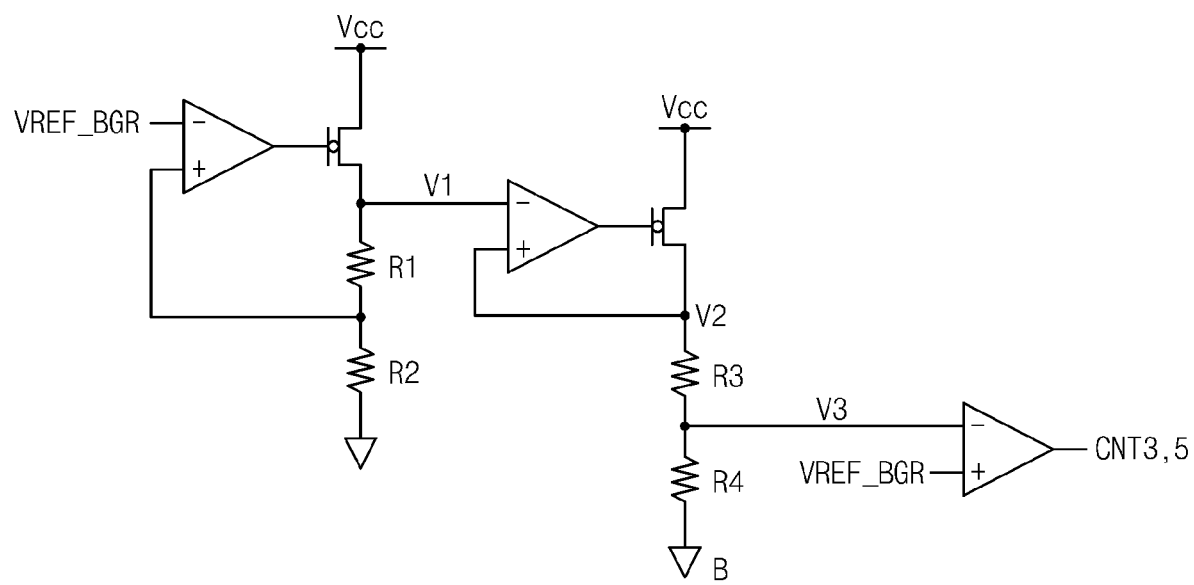

FIGS. 8A and 8B are exemplary input voltage setting circuits which may be used to establish a voltage setting within a voltage sensing unit of an embodiment of the invention. Referring to FIG. 8A, a preliminary program bit line voltage (VPB_CP), a preliminary write high voltage (VPI_CP), a preliminary bulk voltage (VBULK_CP), or a preliminary high negative voltage (VNEG_CP) may be applied to terminal A of a resistor R1. This voltage is distributed by resistors R1 an R2 and applied to the non-inverting input of a constituent comparator. A corresponding reference voltage may be applied the inverting input of the comparator, in order for the comparator to generate a corresponding control signals (e.g., CNT1, CNT2, and CNT4). If a preliminary write high voltage (VPI_CP) is applied, a reference transistor may be additionally provided between resister R1 and terminal A in order to prevent an unintended influence on the threshold voltage of the bit line selection NMOS transistor of cell circuit 40.

Referring to FIG. 8B, a preliminary program bulk voltage (VBULK_CP) or a preliminary high negative voltage (VNEG_CP) is applied to a terminal B of a resistor R4. The voltage is distributed by resistors R3 and R4 and applied to the inverting input of a comparator. In this circuit, resistors R3 and R4 yield a final level voltage (V3) ranging between a power source voltage Vcc and ground Vss by distributing a voltage difference between a second level voltage V2 having a same voltage level as a first level voltage V1 derived from preliminary program bulk voltage VBULK_CP or preliminary high negative voltage (VNEG_CP). In this manner, even if a negative voltage is applied to terminal B, a sensing operation may be properly performed.

Figure 9:
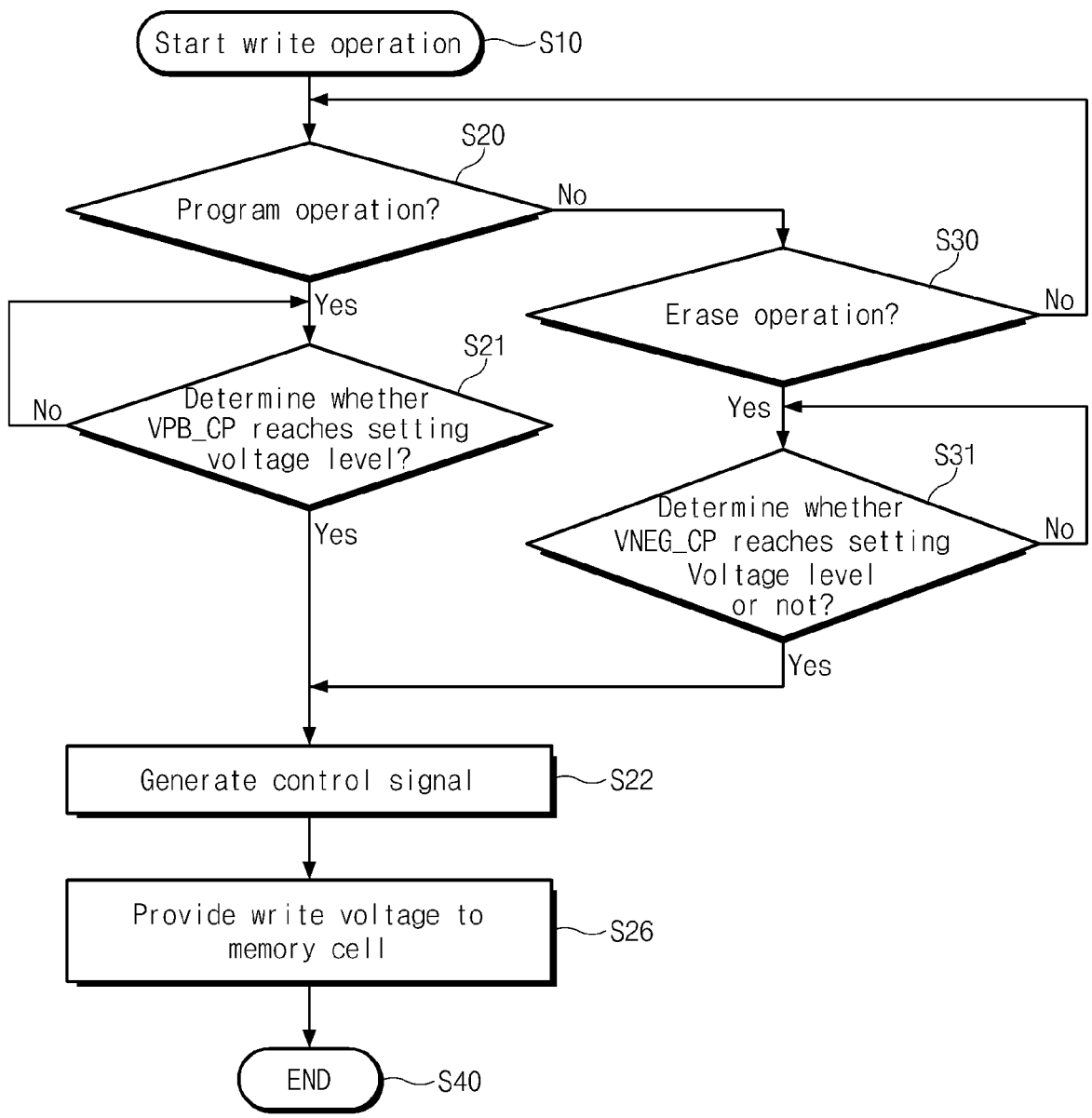
FIG. 9 is a flowchart summarizing a write voltage generating method according to an embodiment of the invention.

FIG. 9 is a flowchart summarizing a write voltage generating method according to an embodiment of the invention. Referring to FIG. 9, once a write operation starts (S10), it is determined whether or not the write operation is a program operation (S20). If the write operation is the program mode, it is sensed whether or not a preliminary program bit line voltage (VPB_CP) has reached a programmable voltage level (S21). If the preliminary program bit line voltage (VPB_CP) reaches the programmable voltage level, a control signal is generated (S22). A switch is then turned ON by the control signal and write voltages required for the program operation are applied to a memory cell (S26). Then, the write operation is terminated (S40).

If, however, the write operation is not a program operation (S20=no), it is determined whether or not the write operation is an erase operation (S30). If the write operation is an erase operation, it is sensed whether or not the preliminary high negative voltage (VNEG_CP) has reached an erasable voltage level (S31). If the preliminary high negative voltage (VNEG_CP) reaches the erasable voltage level, a control signal is generated (S22). The switch is turned ON by the control signal and voltages required for the erase operation are applied to the memory cell (S26). Then, the write operation is terminated (S40).

Figure 10:
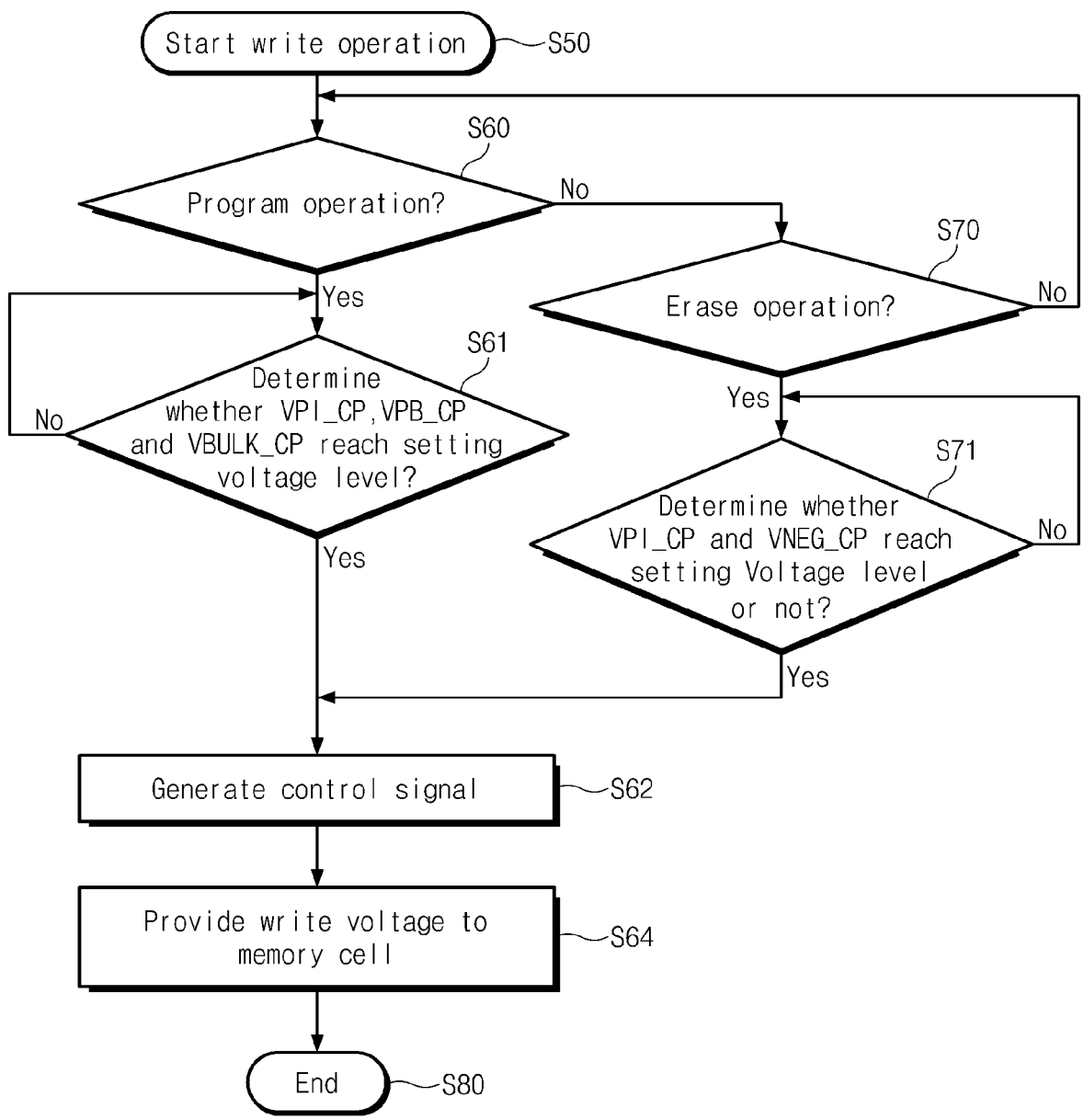
FIG. 10 is a flowchart summarizing a write voltage generating method according to another embodiment of the invention.

FIG. 10 is a flowchart summarizing a write voltage generating method according to another embodiment of the invention. Referring to FIG. 10, once a write operation starts (S50), it is determined whether or not the write operation is a program operation (S60). If the write operation is a program operation, it is sensed whether or not a preliminary program bit line voltage (VPB_CP), a preliminary write high voltage (VPI_CP), and preliminary program bulk voltage (VBULK_CP) have reached programmable voltage levels (S61). If preliminary voltages VPB_CP, VPI_CP, and VBULK_CP have reached the programmable voltage levels, one or more control signal(s) are generated (S62). A switch is turned ON by the control signal(s) and the write voltages required for the program operation are applied to the memory cell (S64). Then, the write operation is terminated (S80).

If, however, the write operation is not a program operation (S60=no), it is determined whether or not the write operation is an erase operation (S70). If the write operation is an erase operation, it is sensed whether or not the preliminary high negative voltage (VNEG_CP) and the preliminary write high voltage (VPI_CP) (i.e., the preliminary program bulk voltage (VBULK_CP)) have reached erasable voltage levels (S71). If erase voltages VNEG_CP and VPI_CP reach erasable voltage levels, one or more control signal are generated (S62). The switch is turned ON by the control signal(s) and voltages required for the erase operation are applied to the memory cell (S62). Then, the write operation is terminated (S80).

Figure 11:
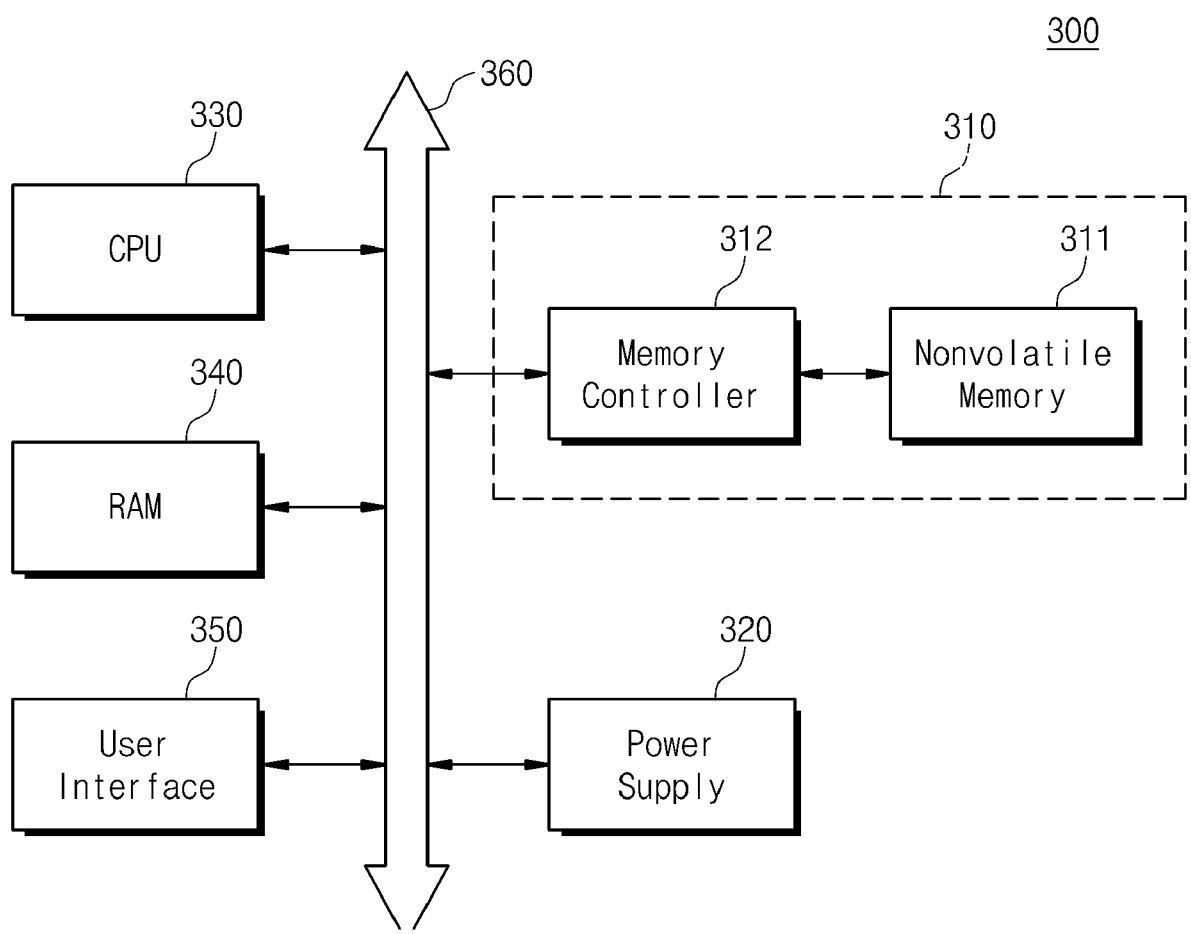
FIG. 11 is a block diagram illustrating a memory system including a non-volatile memory device incorporating a write voltage generating circuit according to an embodiment of the invention.

FIG. 11 is a block diagram illustrating a memory system incorporating a non-volatile memory including a write voltage generating circuit according to an embodiment to the invention. Referring to FIG. 11, a memory system 300 includes a non-volatile memory system 310, a power supply 320, a central processing unit (CPU) 330, a RAM 340, a user interface 350, and a system bus 360.

Non-volatile memory system 310 includes a memory controller 312 and a non-volatile memory 311. Non-volatile memory system 310 is electrically connected to power supply 320, CPU 330, RAM 340, and user interface 350 through system bus 360. The data provided through user interface 350 or processed by CPU 330 is stored in non-volatile memory 311 through memory controller 312. Non-volatile memory 311 includes a write voltage generating circuit according to an embodiment of the invention. This write voltage generating circuit generates voltages required during write operations in non-volatile memory 311. The write voltage generating circuit according to an embodiment of the invention reduces an overall time required for execution of the write operation within non-volatile memory 311. Accordingly, the operating speed of memory system 300 can be improved.

If non-volatile memory system 310 is mounted as a solid state disk (SSD), a booting speed of a system can be drastically faster. Although not illustrated in the drawings, it is apparent to those skilled in the art that the system according to the present invention further includes an application chipset, a camera image processor, etc.

Figure 12:
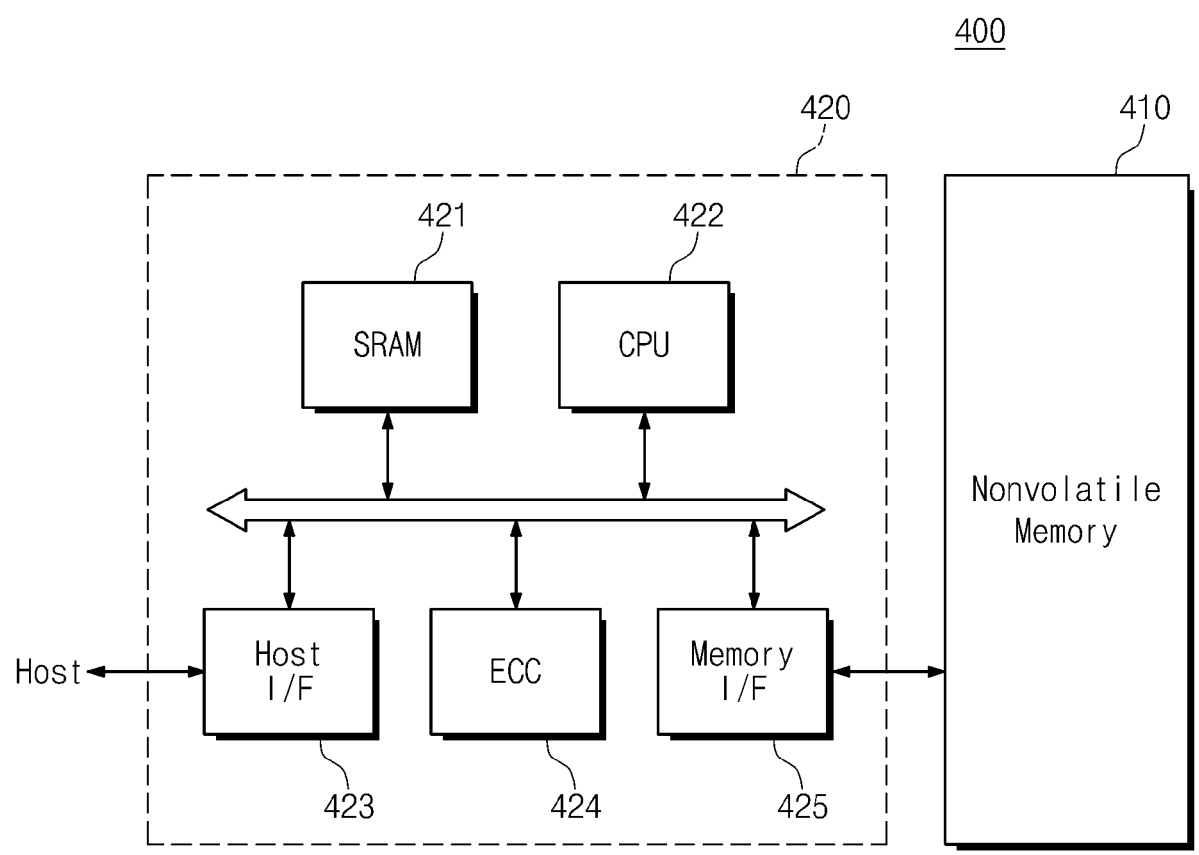
FIG. 12 is a block diagram illustrating a memory card including a non-volatile memory device incorporating a write voltage generating circuit according to an embodiment of the invention.

FIG. 12 is a block diagram illustrating a memory card that includes a non-volatile memory with a write voltage generating circuit according to an embodiment to the invention. Referring to FIG. 12, a memory card 400 supporting a high capacity data storing ability includes a non-volatile memory 410. Memory card 400 includes a memory controller 420 controlling general data exchanges between a host and the non-volatile memory 410. Non-volatile memory 410 includes the write voltage generating circuit according to an embodiment of the invention.

SRAM 421 is used as an operating memory of a CPU 422. A host interface (I/F) 423 includes a data exchange protocol of the host connected to the memory card 400. An error correct code (ECC) 424 detects and corrects errors in data read from the non-volatile memory 410. A memory interface (I/F) 425 interfaces with the non-volatile memory 410. CPU 422 performs general control operations for data exchanges by memory controller 420. Although not illustrated in the drawings, it is apparent to those skilled in the art that memory card 400 may further include ROM (not shown) for string code data to interface with the host.

In a write voltage generating circuit and related method according to embodiments of the invention, even if each output voltage provided by a charge pump has yet to reach a target value, the write operation may nonetheless be performed. Accordingly, the required time for a write operation can be reduced.

The above-disclosed subject matter is to be considered illustrative, and not restrictive, and the appended claims are intended to cover all such modifications, enhancements, and other embodiments, which fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A write voltage generating circuit operating during a write operation and comprising:

a voltage generating unit providing a preliminary write voltage at a level below a defined target level;

a voltage sensing unit receiving the preliminary write voltage and a reference signal, and in response to a comparison between the preliminary write voltage and the reference signal generating a start signal; and a switching unit generating and applying a write voltage derived from the preliminary write voltage at a writeable level to a non-volatile memory cell during the write operation in response to the start signal, wherein the writeable level is less than the target level.

2. The write voltage generating circuit of claim 1, wherein the write operation is a program operation, and the preliminary write voltage comprises at least one of a preliminary program bit line voltage, a preliminary write high voltage, and a preliminary program bulk voltage.

3. The write voltage generating circuit of claim 2, wherein the preliminary write voltage is the preliminary program bit line voltage.

4. The write voltage generating circuit of claim 3, wherein the voltage sensing unit comprises:

a comparator receiving the preliminary program bit line voltage and the reference signal and generating a control signal in response to the comparison between the preliminary program bit line voltage and the reference signal; and a logic unit receiving the control signal and generating the start signal in response to the control signal.

5. The write voltage generating circuit of claim 4, wherein the logic unit comprises:

an AND gate receiving the control signal and generating a first start signal; and an inverter receiving the first start signal and generating a second start signal.

6. The write voltage generating circuit of claim 5, wherein the preliminary write voltage comprises;

the preliminary program bit line voltage and a corresponding program bit line voltage, the preliminary write high voltage and a corresponding write high voltage, the preliminary program bulk voltage and a corresponding program bulk voltage, and a program word line voltage; and the switching unit comprises:

a first complementary MOS transistor switch receiving the first and second start signals and the write high voltage and generating a bit line select signal applied to a bitline selection transistor of the nonvolatile memory cell;

a second complementary MOS transistor switch receiving the first and second start signals and the program word line voltage and generating a program word line cell voltage applied to a gate of a memory cell of the nonvolatile memory cell; and a third complementary MOS transistor switch receiving the first and second start signals and the program bulk voltage and generating a program bulk cell voltage applied to a bulk of the memory cell of the nonvolatile memory cell.

7. The write voltage generating circuit of claim 6, wherein the preliminary bitline voltage reaches a corresponding writeable level before either of the preliminary write high voltage and preliminary program bulk voltage reaches a corresponding writeable level.

8. The write voltage generating circuit of claim 1, wherein the write operation is a program operation and the preliminary write voltage comprises a preliminary program bit line voltage, a preliminary write high voltage, and a preliminary program bulk voltage, and the reference signal comprises a first, second and third reference signal.

9. The write voltage generating circuit of claim 8, wherein the voltage sensing unit comprises:
- a first comparator receiving the preliminary program bit line voltage and the first reference signal and generating a first control signal;
- a second comparator receiving the preliminary write high voltage and the second reference signal and generating a second control signal;
- a first comparator receiving the preliminary program bulk voltage and the third reference signal and generating a third control signal; and
- a logic unit receiving the first, second, and third control signals and generating the start signal.

10. The write voltage generating circuit of claim 9, wherein the logic unit comprises:
- an AND gate receiving the first, second and third control signals and generating a first start signal; and
- an inverter receiving the first start signal and generating a second start signal.

11. The write voltage generating circuit of claim 10, wherein the preliminary write voltage comprises;
- the preliminary program bit line voltage and a corresponding program bit line voltage,
- the preliminary write high voltage and a corresponding write high voltage,
- the preliminary program bulk voltage and a corresponding program bulk voltage, and
- a program word line voltage; and the switching unit comprises:
- a first complementary MOS transistor switch receiving the first and second start signals and the write high voltage and generating a bit line select signal applied to a bitline selection transistor of the nonvolatile memory cell;
- a second complementary MOS transistor switch receiving the first and second start signals and the program word line voltage and generating a program word line cell voltage applied to a gate of a memory cell of the nonvolatile memory cell; and
- a third complementary MOS transistor switch receiving the first and second start signals and the program bulk voltage and generating a program bulk cell voltage applied to a bulk of the memory cell of the nonvolatile memory cell.

12. The write voltage generating circuit of claim 1, wherein the write operation is an erase operation, and the preliminary write voltage comprises at least one of a preliminary write high voltage and a preliminary high negative voltage.

13. The write voltage generating circuit of claim 12, wherein the preliminary write voltage is the preliminary high negative voltage.

14. The write voltage generating circuit of claim 13, wherein the voltage sensing unit comprises:
- a comparator receiving the preliminary high negative voltage and the reference signal and generating a control signal in response to the comparison between the preliminary high negative voltage and the reference signal; and
- a logic unit receiving the control signal and generating the start signal in response to the control signal.

15. The write voltage generating circuit of claim 14, wherein the preliminary write voltage comprises the preliminary write high voltage and a corresponding write high voltage, and the preliminary high negative voltage and a corresponding high negative voltage, and the switching unit comprises:
- a first complementary MOS transistor switch receiving the start signal and the write high voltage and generating an erase high bulk voltage applied to a gate of a memory cell of the nonvolatile memory cell;
- a second complementary MOS transistor switch receiving the start signal and the high negative voltage and generating a high negative cell voltage applied to the bulk of the memory cell of the nonvolatile memory cell.

16. A write voltage generating method, comprising:
determining whether a write operation is a program operation and if so,
- determining that a program voltage having a defined target level has reached a programmable level below the target level,
- generating a control signal in response to the determination that the program voltage has reached the programmable level, and
- providing the program voltage to a nonvolatile memory cell in response to the control signal; and determining whether the write operation is an erase operation and if so,
- determining that an erase voltage having a defined target level has reached an erasable level below the target level,
- generating a control signal in response to the determination that the erase voltage has reached the erasable level, and
- providing the erase voltage to a nonvolatile memory cell in response to the control signal.

17. The method of claim 16, wherein the program voltage is at least one of a preliminary program bit line voltage, a preliminary write high voltage, and a preliminary program bulk voltage.

18. The method of claim 16, wherein the erase voltage is at least one of a preliminary write high voltage and a preliminary high negative voltage.

19. A memory system comprising:
- a non-volatile memory device; and
- a memory controller controlling the non-volatile memory device, wherein the nonvolatile memory device comprises a memory cell array and a write voltage generating circuit generating a write voltage during a write operation performed on the memory cell array, wherein the write voltage generating circuit comprises:
- a voltage generating unit providing a preliminary write voltage at a level below a defined target level;
- a voltage sensing unit receiving the preliminary write voltage and a reference signal, and in response to a comparison between the preliminary write voltage and the reference signal generating a start signal; and
- a switching unit generating and applying a write voltage derived from the preliminary write voltage at a writeable level to a non-volatile memory cell during the write operation in response to the start signal, wherein the writeable level is less than the target level.

20. The memory system of claim 19, wherein the nonvolatile memory device and the memory controller constitute a memory card.

* * * * *